(12) United States Patent
Hara et al.

(10) Patent No.: US 7,366,482 B2
(45) Date of Patent: Apr. 29, 2008

(54) TRANSMISSION DEVICE, TRANSMISSION OUTPUT CONTROL METHOD, AND RADIO COMMUNICATIONS DEVICE

(75) Inventors: Yoshihiro Hara, Hirakata (JP); Mamoru Arayashiki, Yokohama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 455 days.

(21) Appl. No.: 10/529,538

(22) PCT Filed: Aug. 10, 2004

(86) PCT No.: PCT/JP2004/011722

§ 371 (c)(1),
(2), (4) Date: Mar. 29, 2005

(87) PCT Pub. No.: WO2005/036739

PCT Pub. Date: Apr. 21, 2005

(65) Prior Publication Data

US 2006/0046666 A1    Mar. 2, 2006

(30) Foreign Application Priority Data

Oct. 7, 2003    (JP) .............................. 2003-348243

(51) Int. Cl.
*H04B 1/04* (2006.01)
(52) U.S. Cl. ............................... 455/127.1; 455/127.2; 455/102; 455/522; 375/297; 375/300
(58) Field of Classification Search ............ 455/127.1, 455/424, 425, 561, 456.5, 456.6, 550.1, 575.1, 455/23, 42, 522, 91, 102, 108, 110, 127.3, 455/127.2, 127.4, 205, 126, 333, 116; 330/133, 330/149, 10, 140, 297, 277, 285, 278, 129; 375/295, 298, 297, 300, 302, 296, 312

See application file for complete search history.

(56) References Cited

U.S. PATENT DOCUMENTS

| | | | | |
|---|---|---|---|---|
| 5,060,294 A | * | 10/1991 | Schwent et al. | ............... 455/93 |
| 5,432,473 A | * | 7/1995 | Mattila et al. | ............... 330/133 |
| 5,530,923 A | * | 6/1996 | Heinonen et al. | ........... 455/126 |
| 5,559,471 A | * | 9/1996 | Black | ......................... 330/277 |

(Continued)

FOREIGN PATENT DOCUMENTS

JP    3044057    3/2000

(Continued)

*Primary Examiner*—Edward F. Urban
*Assistant Examiner*—Charles Chow
(74) *Attorney, Agent, or Firm*—Pearne & Gordon LLP

(57) ABSTRACT

Either linear operating mode or saturation operating mode is set as the operating mode of a high-frequency power amplifier on the basis of an operating mode set signal. The gain of a variable gain amplifier provided in front of the high-frequency power amplifier and values of output voltage and bias current supplied from a supply voltage/bias current control circuit to the high-frequency power amplifier are switched. The gain of the variable gain amplifier in the saturation operating mode is formed so as to be higher by a predetermined value than that in the linear operating mode. Accordingly, the high-frequency power amplifier operates in the designated operating mode, so that the output transmission power range can be widened.

2 Claims, 9 Drawing Sheets

| | LINER OPERATING MODE | | | SATURATION OPERATING MODE | | |
|---|---|---|---|---|---|---|
| TIME | GAIN OF VARIABLE GAIN AMPLIFIER 14 | VOLTAGE OF SUPPLY VOLTAGE/BIAS CURRENT CONTROL CIRCUIT 17 | CURRENT OF SUPPLY VOLTAGE/BIAS CURRENT CONTROL CIRCUIT 17 | GAIN OF VARIABLE GAIN AMPLIFIER 14 | VOLTAGE OF SUPPLY VOLTAGE/BIAS CURRENT CONTROL CIRCUIT 17 | CURRENT OF SUPPLY VOLTAGE/BIAS CURRENT CONTROL CIRCUIT 17 |
| t(1,1) | $g_1$ | $V_1$ | $I_1$ | $g_1+\alpha$ | $V(1,1)$ | $I(1,1)$ |
| t(1,2) | $g_1$ | $V_1$ | $I_1$ | $g_1+\alpha$ | $V(1,2)$ | $I(1,2)$ |
| t(1,3) | $g_1$ | $V_1$ | $I_1$ | $g_1+\alpha$ | $V(1,3)$ | $I(1,3)$ |
| t(1,4) | $g_1$ | $V_1$ | $I_1$ | $g_1+\alpha$ | $V(1,4)$ | $I(1,4)$ |
| t(1,5) | $g_1$ | $V_1$ | $I_1$ | $g_1+\alpha$ | $V(1,5)$ | $I(1,5)$ |
| t(1,6) | $g_1$ | $V_1$ | $I_1$ | $g_1+\alpha$ | $V(1,6)$ | $I(1,6)$ |
| ⋮ | ⋮ | ⋮ | ⋮ | ⋮ | ⋮ | ⋮ |
| t(n,1) | $g_n$ | $V_n$ | $I_n$ | $g_n+\alpha$ | $V(n,1)$ | $I(n,1)$ |
| t(n,2) | $g_n$ | $V_n$ | $I_n$ | $g_n+\alpha$ | $V(n,2)$ | $I(n,2)$ |
| t(n,3) | $g_n$ | $V_n$ | $I_n$ | $g_n+\alpha$ | $V(n,3)$ | $I(n,3)$ |
| t(n,4) | $g_n$ | $V_n$ | $I_n$ | $g_n+\alpha$ | $V(n,4)$ | $I(n,4)$ |
| t(n,5) | $g_n$ | $V_n$ | $I_n$ | $g_n+\alpha$ | $V(n,5)$ | $I(n,5)$ |
| t(n,6) | $g_n$ | $V_n$ | $I_n$ | $g_n+\alpha$ | $V(n,6)$ | $I(n,6)$ |
| ⋮ | ⋮ | ⋮ | ⋮ | ⋮ | ⋮ | ⋮ |

U.S. PATENT DOCUMENTS

| | | | |
|---|---|---|---|
| 6,020,787 A * | 2/2000 | Kim et al. | 330/279 |
| 6,298,244 B1 * | 10/2001 | Boesch et al. | 455/553.1 |
| 6,437,641 B1 * | 8/2002 | Bar-David | 330/10 |
| 6,580,901 B1 * | 6/2003 | Mochizuki | 455/127.1 |
| 7,009,447 B2 * | 3/2006 | Korol | 330/10 |
| 7,129,786 B2 * | 10/2006 | Kim et al. | 330/297 |
| 7,250,818 B2 * | 7/2007 | Ayun et al. | 330/140 |
| 2002/0030541 A1 * | 3/2002 | Tsutsui et al. | 330/133 |
| 2002/0031191 A1 * | 3/2002 | Shimizu | 375/295 |
| 2002/0071497 A1 * | 6/2002 | Bengtsson et al. | 375/298 |
| 2002/0177420 A1 * | 11/2002 | Sander et al. | 455/108 |
| 2003/0102910 A1 * | 6/2003 | Sevic et al. | 330/10 |
| 2003/0155972 A1 * | 8/2003 | Ngo et al. | 330/133 |
| 2004/0023620 A1 * | 2/2004 | Sahota et al. | 455/91 |
| 2004/0041628 A1 * | 3/2004 | Okubo et al. | 330/149 |
| 2004/0151257 A1 * | 8/2004 | Staszewski et al. | 375/296 |
| 2004/0198258 A1 * | 10/2004 | Tanaka et al. | 455/108 |
| 2004/0203553 A1 * | 10/2004 | Toyota et al. | 455/333 |
| 2004/0247041 A1 * | 12/2004 | Biedka et al. | 375/295 |
| 2004/0266366 A1 * | 12/2004 | Robinson et al. | 455/91 |
| 2005/0017801 A1 * | 1/2005 | Bachman et al. | 330/149 |
| 2005/0176388 A1 * | 8/2005 | Yamawaki et al. | 455/126 |
| 2006/0154626 A1 * | 7/2006 | Maerzinger et al. | 455/127.1 |
| 2006/0159198 A1 * | 7/2006 | Morimoto et al. | 375/297 |

FOREIGN PATENT DOCUMENTS

| | | |
|---|---|---|
| JP | 2002-500846 | 1/2002 |
| JP | 2003-526980 | 9/2003 |
| JP | 2004-104194 | 4/2004 |

* cited by examiner

FIG. 4

| TIME | LINER OPERATING MODE | | | SATURATION OPERATING MODE | | |
|---|---|---|---|---|---|---|
| | GAIN OF VARIABLE GAIN AMPLIFIER 14 | VOLTAGE OF SUPPLY VOLTAGE/BIAS CURRENT CONTROL CIRCUIT 17 | CURRENT OF SUPPLY VOLTAGE/BIAS CURRENT CONTROL CIRCUIT 17 | GAIN OF VARIABLE GAIN AMPLIFIER 14 | VOLTAGE OF SUPPLY VOLTAGE/BIAS CURRENT CONTROL CIRCUIT 17 | CURRENT OF SUPPLY VOLTAGE/BIAS CURRENT CONTROL CIRCUIT 17 |
| t(1,1) | $g_1$ | $V_1$ | $I_1$ | $g_1+\alpha$ | $V(1,1)$ | $I(1,1)$ |
| t(1,2) | $g_1$ | $V_1$ | $I_1$ | $g_1+\alpha$ | $V(1,2)$ | $I(1,2)$ |
| t(1,3) | $g_1$ | $V_1$ | $I_1$ | $g_1+\alpha$ | $V(1,3)$ | $I(1,3)$ |
| t(1,4) | $g_1$ | $V_1$ | $I_1$ | $g_1+\alpha$ | $V(1,4)$ | $I(1,4)$ |
| t(1,5) | $g_1$ | $V_1$ | $I_1$ | $g_1+\alpha$ | $V(1,5)$ | $I(1,5)$ |
| t(1,6) | $g_1$ | $V_1$ | $I_1$ | $g_1+\alpha$ | $V(1,6)$ | $I(1,6)$ |
| ... | ... | ... | ... | ... | ... | ... |
| t(n,1) | $g_n$ | $V_n$ | $I_n$ | $g_n+\alpha$ | $V(n,1)$ | $I(n,1)$ |
| t(n,2) | $g_n$ | $V_n$ | $I_n$ | $g_n+\alpha$ | $V(n,2)$ | $I(n,2)$ |
| t(n,3) | $g_n$ | $V_n$ | $I_n$ | $g_n+\alpha$ | $V(n,3)$ | $I(n,3)$ |
| t(n,4) | $g_n$ | $V_n$ | $I_n$ | $g_n+\alpha$ | $V(n,4)$ | $I(n,4)$ |
| t(n,5) | $g_n$ | $V_n$ | $I_n$ | $g_n+\alpha$ | $V(n,5)$ | $I(n,5)$ |
| t(n,6) | $g_n$ | $V_n$ | $I_n$ | $g_n+\alpha$ | $V(n,6)$ | $I(n,6)$ |
| ... | ... | ... | ... | ... | ... | ... |

TRANSMISSION DEVICE, TRANSMISSION OUTPUT CONTROL METHOD, AND RADIO COMMUNICATIONS DEVICE

TECHNICAL FIELD

The present invention relates to a variable output controllable transmitter, a transmission output control method and a radio communication apparatus using this transmitter.

BACKGROUND ART

Power efficiency and linearity in the transmitting function of a transmitter which can control its output variably are evaluated as indices for measuring the performance of the apparatus. The power efficiency and linearity in the transmitting function are most important indices for expressing the performance of the apparatus particularly in a high-frequency modulation transmitting apparatus such as a mobile phone.

A so-called class A operation amplifier is widely used as an amplifier provided in a last stage of such a high-frequency modulation transmitting apparatus. The class A amplifier is low in distortion, that is, excellent in linearity but poor in power efficiency because the class A amplifier always spends electric power resulting from a DC bias component.

Therefore, a method using a region of saturation of input-output power characteristic of a transistor to change a drain or collector voltage (supply voltage) in accordance with an amplitude component of a baseband signal to thereby amplify power has been devised as a method for operating a power amplifier efficiently. For example, to change average output power, the supply voltage is changed in proportion to desired average output power (e.g. see Patent Document 1).

FIG. 9 is a graph showing an example of input-output power characteristic ($P_{in}$-$P_{out}$ characteristic) of the power amplifier.

As shown in FIG. 9, at each $V_{CC}$, output power $P_{out}$ increases linearly as input power $P_{in}$ increases. When the input power is not lower than a certain value, the output power is saturated at a value $P_s$ corresponding to the supply voltage. The region where the output power $P_{out}$ increases linearly as the input power $P_{in}$ increases is now called "linear region of the power amplifier". The region where the output power $P_{out}$ is saturated regardless of the input power $P_{in}$ is now called "saturation region of the power amplifier". Because the output power in the saturation operating region of the power amplifier is decided by the supply voltage as described above, the output power can be changed every moment so that average output power can be changed when the supply voltage proportional to desired average output power (dB unit) is given.

In the example of the power amplifier shown in FIG. 9, while the input power changes from $P_{i81}$ to $P_{i82}$, the output power changes from $P_{o82}$ to $P_{o83}$ when the supply voltage is changed from $V_{82}$ to $V_{83}$, and the output power changes from $P_{o84}$ to $P_{o85}$ when the supply voltage is changed from $V_{84}$ to $V_{85}$. When the supply voltage $V_{CC}$ proportional to desired average output power is given in this manner, the average output power of the amplifier can be changed.

Incidentally, the mobile phone network has come into the third generation standard system era in recent years. A mobile phone method such as a W-CDMA mobile communication method etc. has been used for mobile multimedia service. In such a third generation mobile phone method, the output level range required of the power amplifier is widened compared with the conventional one. (Patent Document 1) Japanese Patent No. 3,044,057

DISCLOSURE OF THE INVENTION

In the aforementioned transmitter, there was however the situation that the output level range could not be kept sufficiently wide because all the variable output level range of the power amplifier was covered with the saturation operating region in the input-output power characteristic.

Particularly in recent years, the output level range required of the power amplifier in a W-CDMA mobile communication method or the like which is the third generation mobile phone method has reached nearly 100 dB. Accordingly, there was the situation that the requirement could not be satisfied by means of covering all the output level range with the saturation operating region in the input-output power characteristic.

The present invention is provided on such circumstances and an object of the invention is to provide a transmitter, a transmission output control method and a radio communication apparatus in which a wide output level range can be covered while high efficiency and good linearity can be obtained.

The invention provides a transmitter for outputting a transmitting signal while amplifying power of the transmitting signal, comprising: a variable gain amplification means for amplifying an input modulated signal based on the transmitting signal and controlling the gain based on a control signal; a power amplification means connected to the rear of the variable gain amplification means; and a power amplification control means for controlling a supply voltage of the power amplification means on the basis of the control signal, wherein: the power amplification means has a linear operating mode for amplifying power by using a linear operating region in input-output power characteristic of the power amplification means, and a saturation operating mode for amplifying power by using a saturation operating region in input-output power characteristic of the power amplification means; the control signal includes an operating mode set signal for setting the operating mode of the power amplification means; and the power amplification means operates in either operating mode on the basis of the operating mode set signal.

According to this configuration, the high-frequency power amplifier of the transmitter can be operated both in the linear operating mode and in the saturation operating mode, so that the transmitter capable of covering a wide output level range can be achieved.

In the transmitter according to the invention, the modulated signal input to the power amplification means has a temporal change of an amplitude component.

According to this configuration, power efficiency can be improved when instantaneous input power is changed in accordance with instantaneous output power.

In the transmitter according to the invention, the gain of the variable gain amplification means in the case where the power amplification means is operated in the saturation operating mode is controlled to be higher by a predetermined value than that in the case where the power amplification means is operated in the linear operating mode.

According to this configuration, a predetermined difference can be kept between the gain of the variable gain amplification means in the linear operating mode and the gain of the variable gain amplification means in the saturation operating mode. Accordingly, in either the linear operating mode or the saturation operating mode, the wide output level range can be covered with high efficiency while the linearity can be kept good.

In the transmitter according to the invention, the power amplification control means performs control so that the supply voltage is changed in accordance with instantaneous output power of the power amplification means in the saturation operating mode.

According to this configuration, the input signal can be amplified linearly in the saturation operating mode in the same manner as in the linear operating mode. When the saturation operating mode is combined with the linear operating mode, the transmission output level range can be widened.

In the transmitter according to the invention, the power amplification control means performs control so that a bias point set for the power amplification means is changed on the basis of the supply voltage input to the power amplification means.

According to this configuration, the output level can be provided variably while power efficiency can be kept high. In addition, the operating mode can move smoothly between the linear characteristic region of the power amplification means in the linear operating mode and the saturation characteristic region of the power amplification means in the saturation operating mode.

The transmitter according to the invention further comprises an amplitude modulation variable gain amplification means for applying amplitude modulation to a phase-modulated signal obtained by modulation of a phase signal of the transmitting signal and outputting an amplitude-modulated signal, wherein the power amplification means amplifies power on the basis of the amplitude-modulated signal.

According to this configuration, the variable output level range can be taken large, for example, for a polar modulation type transmitter.

In the transmitter according to the invention, the amplitude modulation variable gain amplification means is provided in front of the variable gain amplification means.

According to this configuration, power efficiency can be improved more greatly, for example, for a polar modulation type transmitter.

In the transmitter according to the invention, the amplitude modulation applied to the phase-modulated signal by the amplitude modulation variable gain amplification means is performed on the basis of the supply voltage of the amplitude modulation variable gain amplification means.

According to this configuration, the amplitude modulation by the amplitude modulation variable gain amplification means can be performed by use of the saturation characteristic region of the transistor included in the amplitude modulation variable gain amplification means on the basis of the supply voltage of the amplitude modulation variable gain amplification means. Accordingly, power efficiency of the amplitude modulation variable gain amplification means can be improved.

The transmitter according to the invention further comprises a limiter circuit provided in front of the amplitude modulation variable gain amplification means for converting a sinusoidal signal into a square signal.

According to this configuration, the transistor included in the amplitude modulation variable gain amplification means in the saturation operating mode can be switched on and off quickly. Accordingly, power efficiency of the amplitude modulation variable gain amplification means can be improved more greatly.

The transmitter according to the invention further comprises a multiplier for multiplying the amplitude signal of the transmitting signal and the phase-modulated signal obtained by modulation of the phase signal of the transmitting signal to thereby apply amplitude modulation, wherein the power amplification means performs power amplification on the basis of the amplitude-modulated signal.

According to this configuration, a mixer can be used in place of the amplitude modulation variable gain amplification means as the amplitude modulation means. While the circuit configuration of the amplitude modulation variable gain amplification means can be diversified, the circuit configuration can be simplified.

In the transmitter according to the invention, the multiplier is provided in front of the variable gain amplification means.

According to this configuration, the mixer can be disposed as near to the low-power front stage side as possible to suppress power loss to a minimum so that blocks on and after the variable gain amplifier can be operated in the saturation mode. High power efficiency can be achieved as a whole.

The transmitter according to the invention further comprises: an amplitude/phase extraction means for receiving the transmitting signal as an input and extracting amplitude and phase components of the transmitting signal on the basis of in-phase and quadrature components of the transmitting signal; and a phase modulation means for outputting a phase-modulated high-frequency signal on the basis of the phase component of the transmitting signal.

According to this configuration, circuits after modulation of the input signal till acquisition of the phase-modulated high-frequency signal input to the variable gain amplification means can be configured surely by a heretofore general circuit configuration. The conventional transmitter can be reformed into the transmitter according to the invention easily.

The transmitter according to the invention further comprises a quadrature modulator for receiving the transmitting signal as an input, applying phase modulation and amplitude modulation to the transmitting signal and outputting the modulated transmitting signal to the variable gain amplification means.

According to this configuration, while the circuit configuration after modulation of the input signal till acquisition of the modulated high-frequency signal input to the variable gain amplification means can be diversified, the circuit configuration can be simplified.

The transmission output control method according to the invention is a transmission output control method for controlling a transmission output, comprising the steps of: amplifying an input modulated signal (variable gain amplification step); amplifying power in a state in which an output generated by the variable gain amplification step is input to a power amplification means (power amplification step); and controlling a supply voltage to the power amplification means and an input to the power amplification means to thereby control the operating mode of the power amplification means to switch the operating mode over between a linear operating mode for operating the power amplification means in a linear operating region in input-output power characteristic of the power amplification means and a saturation operating mode for operating the power amplification means in a saturation operating region in the input-output power characteristic (operating mode control step).

According to this configuration, the high-frequency power amplifier of the transmitter can be operated both in the linear operating mode and in the saturation operating mode. Accordingly, the transmission output control method capable of covering a wide output level range can be achieved.

The invention provides a radio communication apparatus having the aforementioned transmitter.

According to this configuration, the size of the high-frequency power amplifier of the transmitter can be reduced. Accordingly, while the size of the radio communication apparatus can be reduced more greatly, the wide output level range can be covered.

According to the transmitter, the transmission output control method and the radio communication apparatus according to the invention, there can be provided a transmitter, a transmission output control method and a radio communication apparatus in which a wide output level range can be covered while high efficiency and good linearity can be obtained.

BRIEF DESCRIPTION OF THE DRAWINGS

FIG. 4 is a table showing an example of transition of the gain of the variable gain amplifier operated in the linear or saturation mode and the supply voltage and bias current per time, given from the supply voltage/bias current control circuit.

Figure 1:
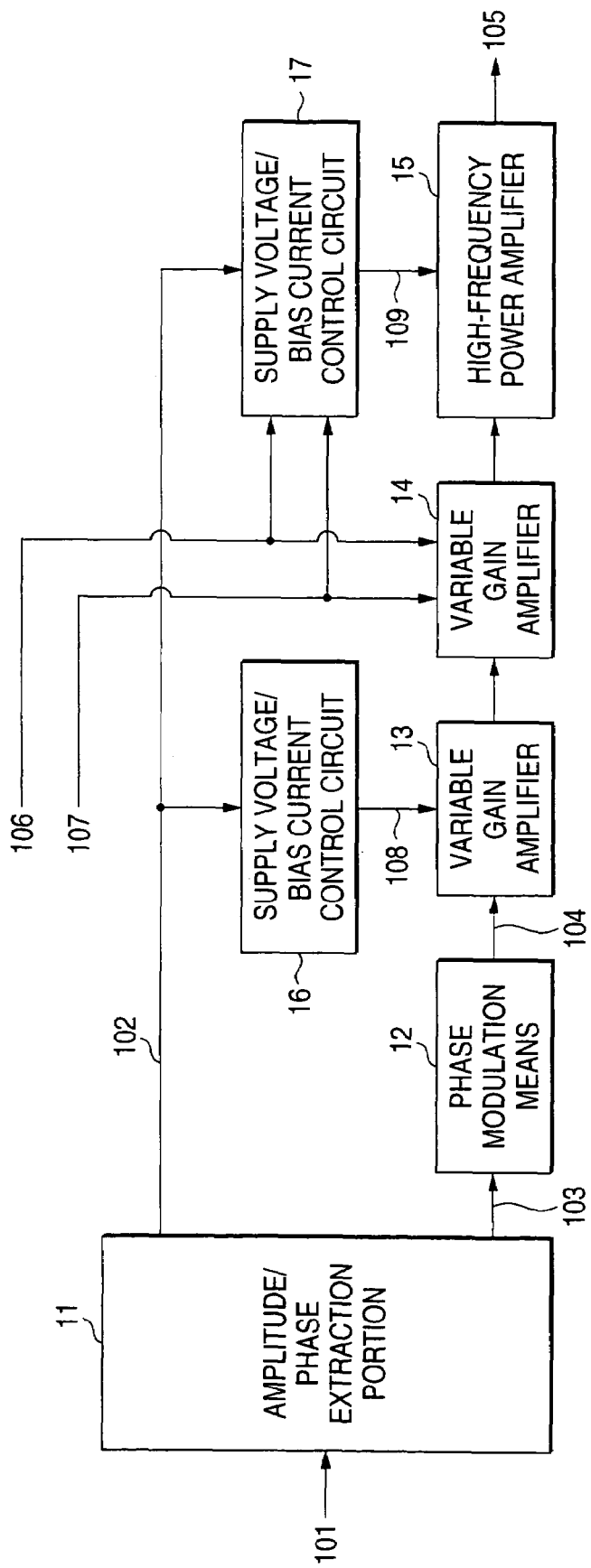
FIG. 1 is a schematic configuration diagram showing a transmitter for explaining a first embodiment of the invention.

In the drawings, the reference numeral 11 designates an amplitude/phase extraction portion; 12, a phase modulation means; 13 and 14, variable gain amplifiers; 15, a high-frequency power amplifier; 16 and 17, supply voltage/bias current control circuits; 21, a mixer; 106, an average output level control signal; and 107, an operating mode set signal.

BEST MODE FOR CARRYING OUT THE INVENTION

First Embodiment

FIG. 1 is a schematic configuration diagram showing a transmitter for explaining a first embodiment of the invention. For example, the transmitter shown in FIG. 1 is a high-frequency transmitting portion of a mobile phone using a polar modulation method.

As shown in FIG. 1, the transmitter according to the first embodiment comprises: an amplitude/phase extraction portion 11 for separating an input baseband IQ signal 101 into a baseband amplitude signal 102 and a baseband phase signal 103 and outputting the signals 102 and 103; a phase modulation means 12 for applying phase modulation of a carrier signal on the baseband phase signal 103 and outputting a phase-modulated high-frequency signal 104; variable gain amplifiers 13 and 14 for amplifying the phase-modulated high-frequency signal 104; and a high-frequency power amplifier 15 for amplifying high-frequency power output from the variable gain amplifier 14 and outputting a transmitter signal 105.

The transmitter according to the first embodiment further comprises: a supply voltage/bias current control circuit 16 for generating a supply voltage 108 and a bias current to the first variable gain amplifier 13 on the basis of the baseband amplitude signal 102; and a supply voltage/bias current control circuit 17 for generating a supply voltage 109 and a bias current to the high-frequency power amplifier 15 on the basis of the baseband amplitude signal 102, an average output level control signal 106 and an operating mode set signal 107.

The amplitude/phase extraction means 11 extracts amplitude and phase components of the baseband signal from in-phase (I signal) and quadrature (Q signal) components of the baseband IQ signal 101 and outputs the baseband amplitude signal 102 and the baseband phase signal 103.

The phase modulation means 12 generates a phase-modulated high-frequency signal on the basis of the baseband phase signal 103 output from the amplitude/phase extraction means 11 and outputs the phase-modulated high-frequency signal 104. The phase-modulated high-frequency signal 104 is a constant envelope signal having an amplitude component without time change.

The supply voltage/bias current control circuit 16 generates a supply voltage 108 and a bias current to be input into the variable gain amplifier 13 on the basis of the baseband amplitude signal 102 output from the amplitude/phase extraction means 11. That is, the supply voltage/bias current control circuit 16 operates so that a bias point to be set for the variable gain amplifier 13 is changed on the basis of the supply voltage input into the variable gain amplifier 13. Incidentally, the supply voltage 108 is a voltage proportional to the amplitude component (i.e. power) of the baseband signal in a moment of time.

The variable gain amplifier 13 operates in a saturated amplification mode on the basis of the supply voltage 108 generated by the supply voltage/bias current control circuit 16 to thereby apply amplitude modulation to the phase-modulated high-frequency signal 104. The amplitude modulation can make power efficiency high because a saturation characteristic region of a transistor is used.

The operating mode set signal 107 is a signal for switching the operating mode of the high-frequency power amplifier 15 over to a linear operation or a saturation operation. For example, the operating mode set signal 107 is set according to desired average output power. For example, the average output level control signal 106 and the operating mode set signal 107 are set by a control portion. The control portion may be provided in the inside of the transmitter per se. For example, when the transmitter is provided in a radio communication apparatus or the like, the control portion may serve as a control portion for controlling the operation of the radio communication apparatus.

Although the variable gain amplifier 14 amplifies the output signal of the variable gain amplifier 13, the gain of the variable gain amplifier 14 is controlled on the basis of the average output level control signal 106 and the operating mode set signal 107. Incidentally, as will be described later, the difference in the gain of the variable gain amplifier 14 between these operating modes is a predetermined gain.

The supply voltage/bias current control circuit 17 generates a supply voltage 109 and a basis current to the high-frequency power amplifier 15 on the basis of the baseband amplitude signal 102 extracted by the amplitude/phase extraction means 11, the average output level control signal 106 and the operation mode set by the operating mode set signal 107. That is, the supply voltage/bias current control circuit 17 operates so that a bias point to be set for the high-frequency power amplifier 15 is changed on the basis of the supply voltage input into the high-frequency power amplifier 15. As will be described later, the supply voltage/bias current control circuit 17 outputs a supply voltage and a bias current corresponding to average output when the supply voltage/bias current control circuit 17 is in the linear operating mode (hereinafter referred to as "linear mode") and the supply voltage/bias current control circuit 17 outputs a supply voltage and a bias current corresponding to instantaneous output power when the supply voltage/bias current control circuit 17 is in the saturation operating mode (hereinafter referred to as "saturation mode").

The high-frequency power amplifier 15 amplifies the modulated signal output from the variable gain amplifier 14 in the linear or saturation mode on the basis of the supply voltage 109 of the supply voltage/bias current control circuit 17 and outputs a transmitter signal 105.

Figure 2:
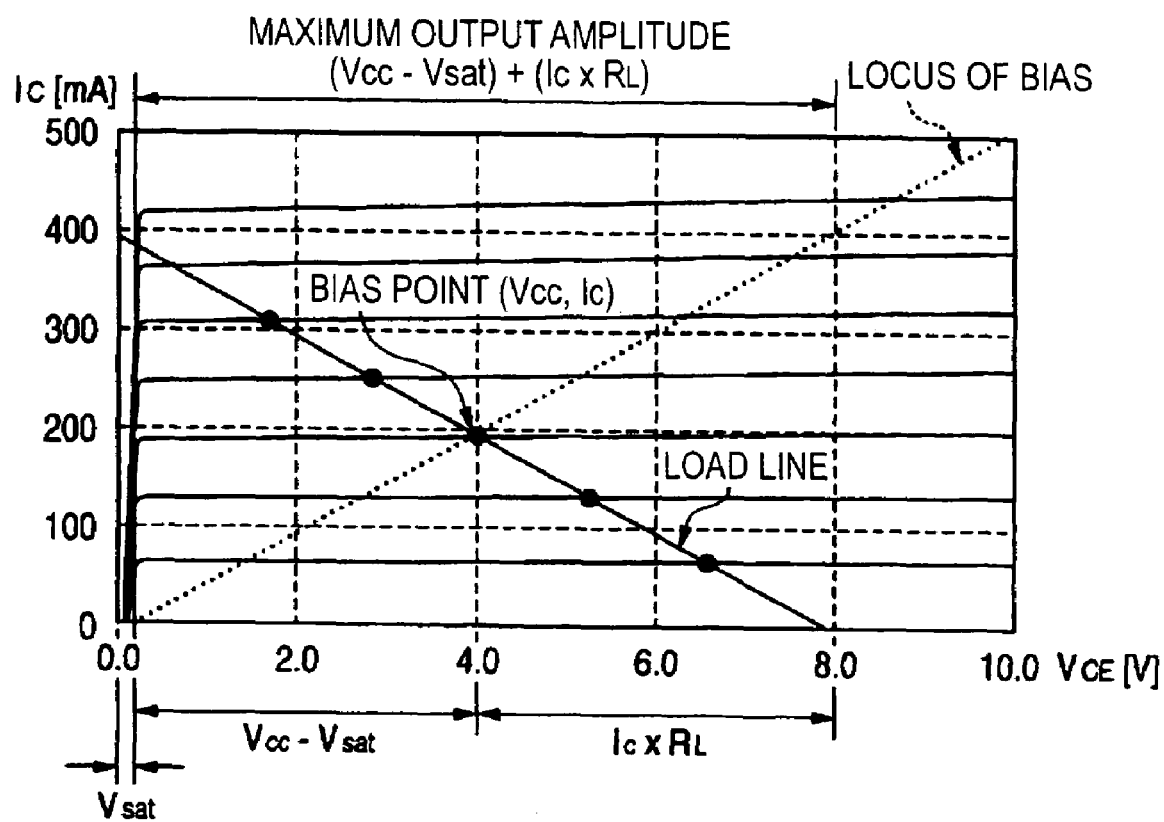
FIG. 2 is a graph showing static characteristic of an amplification transistor provided in the high-frequency power amplifier of the transmitter according to the first embodiment of the invention.

Next, the supply voltage/bias current control for the high-frequency power amplifier 15 will be described. FIG. 2 is a graph showing static characteristic of an amplification transistor provided in the high-frequency power amplifier 15 of the transmitter according to the first embodiment of the invention.

In FIG. 2, curves each indicating the saturation characteristic show characteristics between an emitter-collector voltage ($V_{CE}$) and a collector current ($I_C$) of the amplification transistor in the inside of the high-frequency power amplifier 15. In FIG. 2, the parameter is a base current ($I_B$). Incidentally, description will be made on the case where the amplification transistor in the inside of the high-frequency power amplifier 15 is a bipolar transistor.

In FIG. 2, the straight line expressed by the solid line shows a load line (impedance: $R_L$) of the amplification transistor. Incidentally, the amplification transistor is an emitter-grounded circuit which makes a so-called class A operation in which an operating point in the collector output moves with the bias point ($V_{CC}$, $I_C$) shown in FIG. 2 as its center and in a range including the black-dot points shown in FIG. 2 in accordance with change in the input base current.

In the linear mode, that is, in the case where the output is not saturated, the range of movement of the operating point is decided on the basis of the amplitude (i.e. input power) of the input base signal. In the class A operation, amplification excellent in linearity without distortion can be performed. Power efficiency η in the class A operation is defined as the ratio of power spent by the load to power supplied by the power supply. When the output amplitude is $k$ times ($0 \leq k \leq 1$) as much as the maximum output amplitude, the power efficiency η is given as $k^2/2$. In this manner, power efficiency takes the highest value of 50% when k=1, that is, when the output amplitude is equal to the maximum output amplitude (in the case where a coil is inserted in a power supply line).

The maximum output amplitude is a quantity decided on the basis of the input voltage, the supply voltage $V_{CC}$ (supply voltage 109 in this case) and the bias current $I_C$. As shown in FIG. 2, the voltage amplitude from the bias point in the output is generated in such a manner that the lower side is limited by $V_{CC}-V_{sat}$ while the upper side is limited by $I_C \times R_L$. As a result, the maximum output amplitude is equal to ($V_{CC}-V_{sat}$)+($I_C \times R_L$). Accordingly, in order to improve power efficiency in the linear mode without distortion of output power, it is preferable that the width of the lower side of the voltage amplitude and the width of the upper side of the voltage amplitude are equal to each other and close to the maximum output amplitude. That is, it is preferable that the supply voltage $V_{CC}$ (supply voltage 109 in this case) and the bias current $I_C$ are controlled to satisfy the relational equation (1).

$$V_{CC} - V_{sat} = I_C \times R_L \qquad (1)$$

That is, when $I_C$ decided by the equation (1) in accordance with each $V_{CC}$ is provided as the bias current, efficiency can be improved to the maximum limit while distortion can be kept low. That is, the bias current $I_C$ (hence bias current $I_b$) to be given to the high-frequency power amplifier 15 is changed in accordance with the supply voltage $V_{CC}$. Incidentally, in FIG. 2, the loci of $V_{CC}$ and $I_C$ satisfying the relation of the equation (1) (the loci of bias points) are expressed by the broken straight line. In the transmitter according to this embodiment, efficiency can be kept to the maximum limit because the bias point is set on the broken straight line so that the bias point becomes far from the origin when the output amplitude is large, and that the bias point becomes close to the origin when the output amplitude is small.

Incidentally, when the output amplitude reaches the upper limit on the lower or upper side, output power does not increase any more but is saturated to get into the saturation mode in spite of increase in input power under a predetermined bias condition ($V_{CC}$ and $I_C$). Incidentally, such an operation is called "saturated class A operation" in which power efficiency can be increased. Also in the saturation mode, shifting between the linear operation and the saturation operation can be performed quickly and smoothly because the amplitude value on the lower side with respect to the bias point and the amplitude value on the upper side with respect to the bias point are saturated in the same degree if the bias condition is set to satisfy the equation (I).

Figure 3:
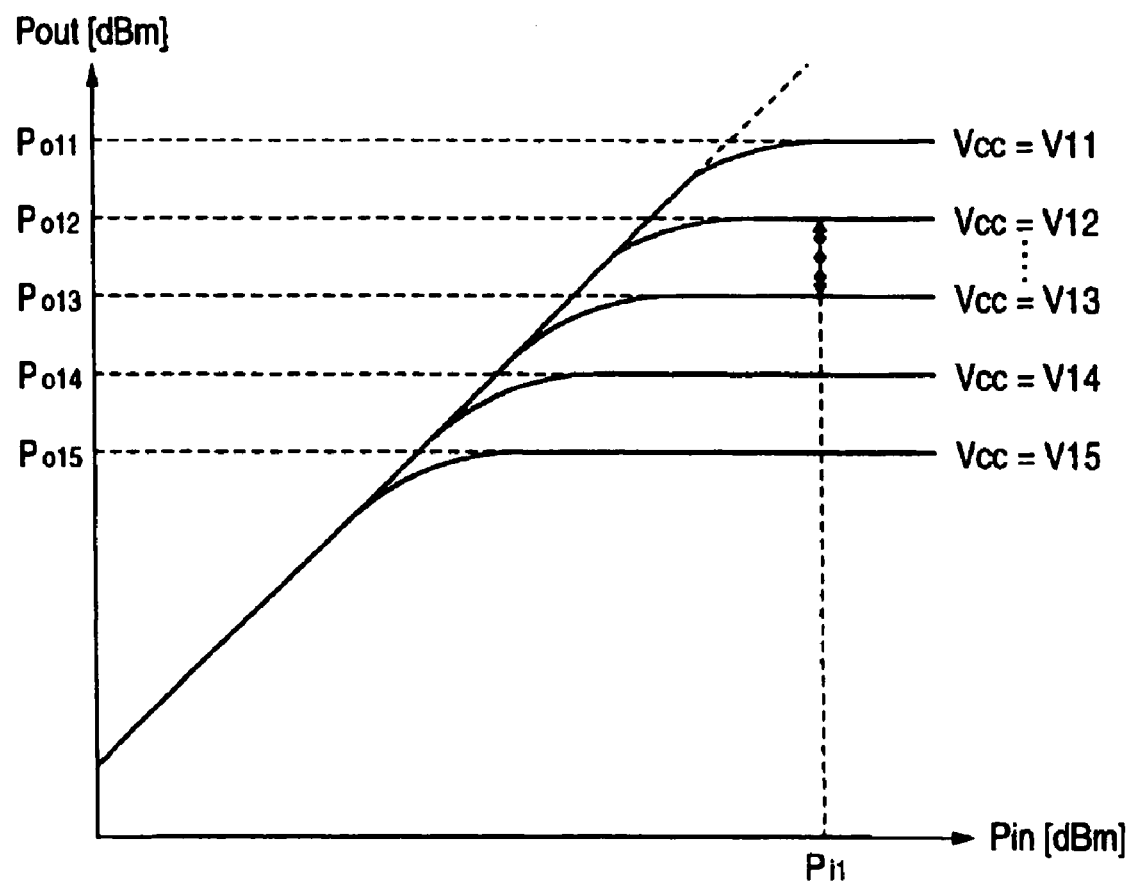
FIG. 3 is a graph showing input-output power characteristic ($P_{in}$-$P_{out}$ characteristic) of the variable gain amplifier.

FIG. 3 is a graph showing input-output power characteristic ($P_{in}$-$P_{out}$ characteristic) of the variable gain amplifier 13. Next, amplitude modulation using the saturation mode by the variable gain amplifier 13 will be described with reference to FIG. 3.

In FIG. 3, the curves show input-output power characteristic ($P_{in}$-$P_{out}$ characteristic) of the variable gain amplifier 13 in accordance with each of different values of the supply voltage $V_{CC}$ (supply voltage 108 in this case).

As shown in FIG. 3, in each value of the supply voltage $V_{CC}$ (supply voltage 108 in this case), output power $P_{out}$ increases linearly as input power $P_{in}$ increases. When the input power $P_{in}$ is not lower than a certain value, the output power $P_{out}$ is saturated to output power $P_o$ corresponding to each value of the supply voltage $V_{CC}$ (supply voltage 108 in this case). On this occasion, the saturated output power $P_o(W)$ is proportional to the square of the supply voltage $V_{CC}$ (supply voltage 108 in this case).

Because the input of the variable gain amplifier 13 is wave only phase-modulated with constant amplitude, that is, modulated wave with a constant value $P_{i1}$ of input power, instantaneous output power $P_{out}$ is generally unchanged if the supply voltage 108 is constant. In the transmitter according to this embodiment, because the supply voltage 108 is proportional to the desired instantaneous amplitude signal so as to be variable as described above, the output power $P_{out}$ changes from $P_{o12}$ to $P_{o13}$ as represented by the black dots and arrows in FIG. 3 so that amplitude modulation can be applied to the phase modulated input signal in the saturation amplification mode when, for example, the supply voltage 108 changes from $V_{12}$ to $V_{13}$.

Next, the amplifying operation of the high-frequency power amplifier 15 in the linear or saturation mode will be described. First, the operating mode is set on the basis of the operating mode set signal 107 in order to designate whether the high-frequency power amplifier 15 is to be operated in the linear mode or in the saturation mode. The gain of the variable gain amplifier 14 prior to the high-frequency power amplifier 15 and the output (supply voltage 109 and bias current) given from the supply voltage/bias current control circuit 17 are switched in accordance with the set operating mode.

FIG. 4 is a table showing an example of transition of the gain of the variable gain amplifier 14 operated in the linear or saturation mode and the supply voltage 109 and bias current per time, given from the supply voltage/bias current control circuit 17. In the table, m expresses a minimum unit for designating average transmitting power, that is, a slot number, and n expresses a minimum step in the slot when t (m, n) is the time, V(m, n) is the voltage of the supply voltage/bias current control circuit 17, and I(m, n) is the current of the supply voltage/bias current control circuit 17. That is, t(m, n), V(m, n) and I(m, n) express the time, voltage value and current value in the n-th step in the m-th slot, respectively.

As shown in FIG. 4, when constant average power is to be output, the gain of the variable gain amplifier 14 in the saturation mode takes a value larger by a predetermined value α dB than the gain g in the linear mode. In the linear mode, the supply voltage 109 given from the supply voltage/bias current control circuit 17 to the high-frequency power amplifier 15 takes a value corresponding to the average output power of the variable gain amplifier 14. In the saturation mode, the supply voltage 109 takes a value corresponding to the instantaneous output power of the variable gain amplifier 14 at each point of time. Incidentally, for example, α is a value of about 10 dB.

Figure 5:
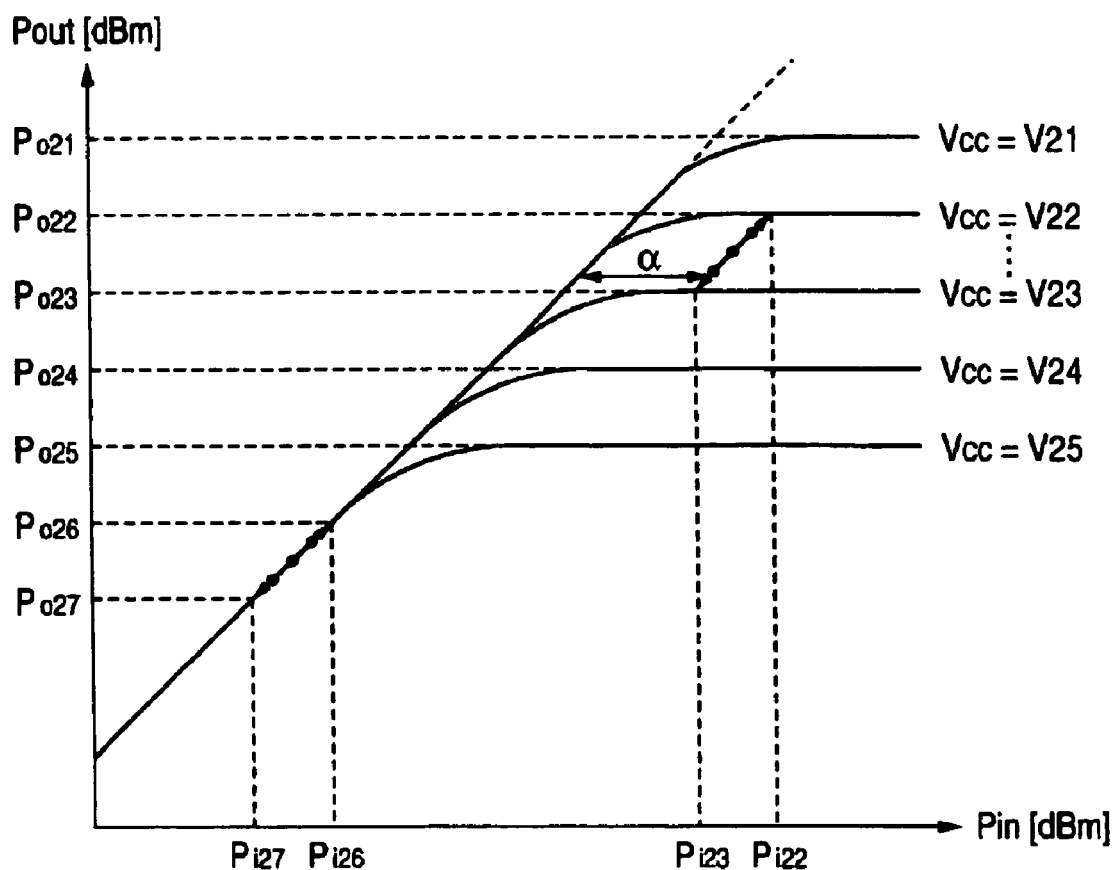
FIG. 5 is a graph showing input-output power characteristic ($P_{in}$-$P_{out}$ characteristic) of the high-frequency power amplifier in the linear or saturation mode.

FIG. 5 is a graph showing input-output power characteristic ($P_{in}$-$P_{out}$ characteristic) of the high-frequency power amplifier 15 in the linear or saturation mode. Next, the operation of the high-frequency power amplifier 15 in the linear or saturation mode will be described with reference to FIG. 5.

First, when the desired output level is large, it is preferable from the point of view of power efficiency that the saturation characteristic region of $P_{in}$-$P_{out}$ characteristic shown in FIG. 5 is used. When the saturation mode is set by the operating mode set signal 107, the input signal of the high-frequency power amplifier 15 (i.e. the output power of the variable gain amplifier 14) becomes higher by α dB than that in the linear mode as shown in FIG. 4. Because the region in which $P_{in}$-$P_{out}$ characteristic is fully saturated can be used when the gain is made higher by α dB as described above, the linearity of amplitude modulation by the supply voltage 109 can be made good. When the supply voltage 109 is given to the high-frequency power amplifier 15 on the basis of the instantaneous output power in this state, the supply voltage 109 changes from $V_{22}$ to $V_{23}$ to thereby make it possible to change the output power $P_{out}$ of the high-frequency power amplifier 15 from $P_{o22}$ to $P_{o23}$ as represented by the black dots and arrows in FIG. 5 when, for example, the input power $P_{in}$ of the high-frequency power amplifier 15 changes from $P_{i22}$ to $P_{i23}$.

In the saturation mode, because the gain of the variable gain amplifier 14 becomes higher by α dB on the basis of the operating mode set signal 107 as described above, the high-frequency power amplifier 15 operates in the saturation region. Also in the saturation amplification mode, the modulated input wave can be amplified linearly when the supply voltage 109 is given on the basis of the instantaneous output power.

Next, also in the case where the desired output level of the high-frequency power amplifier 15 is low, it is preferable from the point of view of power efficiency that the bias point is made as close to the origin as possible while the high-frequency power amplifier 15 is operated to be saturated. When the bias point is brought close to the origin, it is however difficult to change the amplitude component accurately in accordance with the supply voltage 109 because of the saturation voltage etc. between the emitter and collector of the bipolar transistor. It is therefore necessary to switch the operating mode to the linear operation when the output is not higher than suitable power.

Accordingly, in this case, because the linear mode is set by the operating mode set signal 107, the input power of the high-frequency power amplifier 15 becomes lower by α dB than that in the saturation mode as shown in FIG. 4. Accordingly, when the supply voltage 109 is given on the basis of the average output power to thereby fix the supply voltage 109 to $V_{25}$ to avoid the saturation mode as shown in FIG. 5 while the instantaneous input power $P_{in}$ changes from $P_{i26}$ to $P_{i27}$, the output power $P_{out}$ can be changed from $P_{o26}$ to $P_{o27}$ as represented by the black dots and arrows in FIG. 5.

Figure 6:
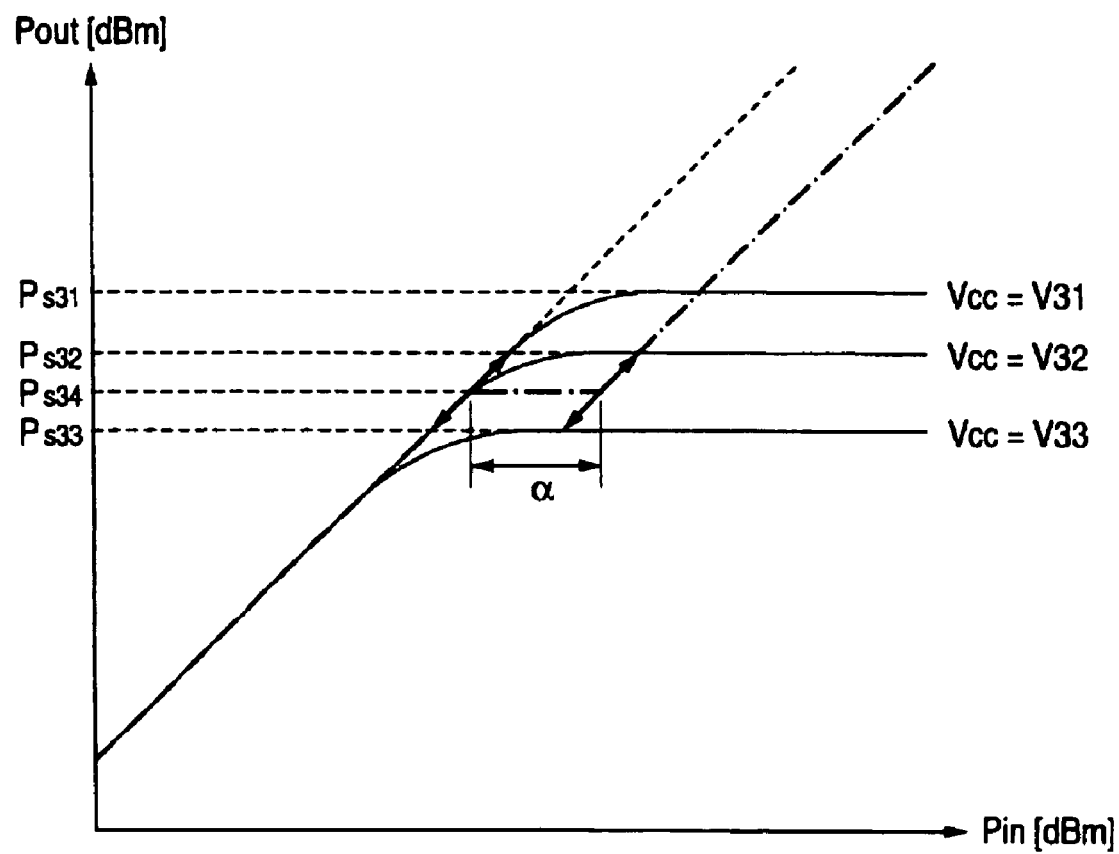
FIG. 6 is a graph showing change of an operating point in the case where each of the linear mode and the saturation mode is switched over to the other when the average output power of the high-frequency power amplifier exhibits a certain constant value.

FIG. 6 is a graph showing change of an operating point in the case where each of the linear mode and the saturation mode is switched over to the other when the average output power of the high-frequency power amplifier 15 exhibits a certain constant value. In FIG. 6, each arrow portion shows change of the operating point in the linear or saturation mode in the case where the modulated input wave has a variation of the amplitude component and the average output level, maximum output level and minimum output level of the high-frequency power amplifier 15 are $P_{s34}$, $P_{s32}$ and $P_{s33}$ respectively.

When the high-frequency power amplifier 15 operates in the linear mode, the supply voltage 109 is $V_{31}$. Accordingly, low-distortion amplification can be performed because the supply voltage 109 gives a margin from the average output level $P_{s34}$ to the saturation output level. In the transmitter according to the invention, the bias current as well as the supply voltage 109 is optimized as described above so that power efficiency can be kept high.

To switch the mode of the high-frequency power amplifier 15 from the linear mode to the saturation mode, the operating mode set signal 107 is turned over so that the gain of the variable gain amplifier 14 and the supply voltage 109 and bias current given to the high-frequency power amplifier 15 are changed to values shown in FIG. 4. On this occasion, as shown in FIG. 6, for example, in the case of the average output power $P_{s34}$, the supply voltage 109 can take values of from $V_{32}$ to $V_{33}$ in accordance with the maximum and minimum values of instantaneous output power. Also in the saturation mode, the bias current can be optimized to smoothen transition between the operating modes. It is a matter of course that such characteristic can be applied to the case where the mode of the high-frequency power amplifier 15 changes from the saturation mode to the linear mode.

In FIG. 6, the one-dot chain line shows the relation between average input power and average output power in the case where each of the linear mode and the saturation mode is switched over to the other at the average output power $_{s34}$, that is, in the case where operation is performed in the linear mode at output power of $P_{s34}$ or lower but operation is performed in the saturation mode at output power of $P_{s34}$ or higher.

When the gain of the variable gain amplifier 14 is increased by a predetermined value ($\alpha$ dB) and the supply voltage given to the high-frequency power amplifier 15 is controlled as described in this embodiment on the basis of the operating mode set signal 107, the operating mode of the high-frequency power amplifier 15 can be changed from the linear mode to the saturation mode. Accordingly, power amplification with high efficiency and good linearity in a wide output power range can be performed by use of one and the same power amplifier.

As described above, in the transmitter according to the invention, the supply voltage and the bias current are optimized in accordance with average or instantaneous output power. Accordingly, power efficiency can be kept so high that change of the bias condition can be suppressed to a minimum when each of the linear mode and the saturation mode is changed over to the other. In addition, transition characteristic and disturbance to the outside at the mode change can be suppressed to a minimum.

Although this embodiment has been described on the case where the variable gain amplifier 13 is directly connected to the output of the phase modulation means 12 as shown in FIG. 1, a limiter circuit may be inserted in the output of the phase modulation means 12 to convert sinusoidal wave into square wave. In this case, power efficiency can be improved more greatly because the transistors in the saturation mode of the rear-stage variable gain amplifier 13 and the high-frequency power amplifier 15 can be switched on and off quickly.

Although this embodiment has been described on the case where amplitude modulation in the variable gain amplifier 13 is performed on the basis of the supply voltage 108, amplitude modulation may be performed on the basis of another signal such as a gain control signal.

Although this embodiment has been described on the case where the supply voltage 109 given to the high-frequency power amplifier 15 in the linear mode is set in accordance with the average output power, the supply voltage 109 may be changed in accordance with the instantaneous output power. In this case, when so-called back-off of the output voltage from the supply voltage is suppressed to a minimum in a range in which the high-frequency power amplifier 15 can operate in the linear mode, reduction in efficiency in the linear mode can be suppressed to a minimum (such an operation is called "envelope tracking operation").

When configuration is made so that the bias current control is applied not only to the variable gain amplifier 13 and the high-frequency power amplifier 15 but also to the variable gain amplifier 14, power efficiency can be improved more greatly.

Although this embodiment has been described on the case where the amplification transistor in the inside of the high-frequency power amplifier 15 is a bipolar transistor, the same effect as described above can be obtained as the effect of the invention when another transistor material and kind such as a field-effect transistor (FET) is used (inclusive of the variable gain amplifiers 13 and 14). In this case, however, not the bias current but a bias voltage is applied to the field-effect transistor for setting the bias point because the field-effect transistor is driven by a voltage. The invention can be applied to operation classes and modulation methods of various amplifiers. For example, even in the case where the modulated signal has no variation of the amplitude component except phase modulation (or frequency modulation), the effect of controlling the output level in a wide range can be obtained when the mode of the power amplifier is switched over between the linear mode and the saturation mode.

Although this embodiment has been described on the case where the variable gain amplifier 14 posterior to the variable gain amplifier 13 operates in the linear mode, the variable gain amplifier 14 may be operated in the saturation mode in the same manner as the high-frequency power amplifier 15. In this case, the gain of the variable gain amplifier 14 is changed by a predetermined value $\alpha$ in accordance with the operating mode of the high-frequency power amplifier 15.

Although this embodiment has been described on the case where the variable gain amplifier 13 for amplitude modulation is disposed between the phase modulation means 12 and the variable gain amplifier 14, the variable gain amplifier 13 for amplitude modulation may be disposed in the rear of the variable gain amplifier 14. Also in this case, the effect of the invention can be obtained when the gain of the variable gain amplifier 14 is changed by a predetermined value $\alpha$ in accordance with the operating mode of the high-frequency power amplifier 15.

Second Embodiment

Figure 7:
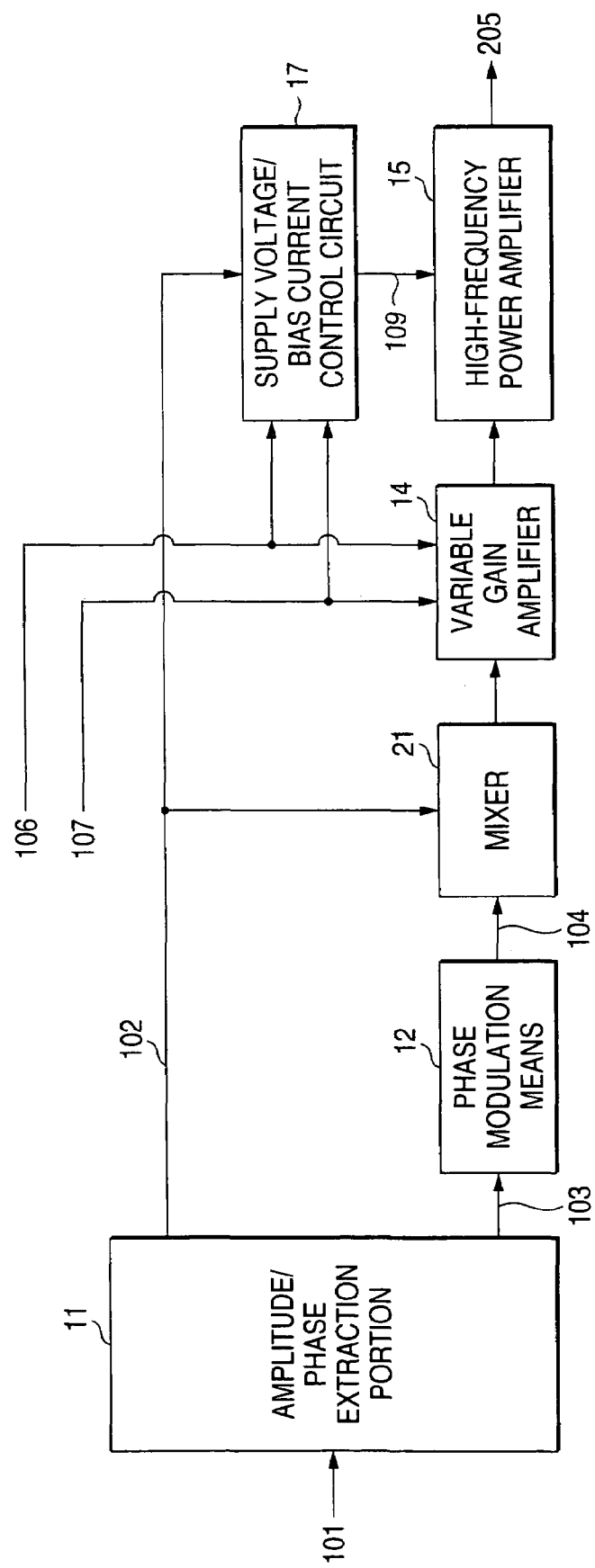
FIG. 7 is a schematic configuration diagram showing a transmitter for explaining a second embodiment of the invention.

FIG. 7 is a schematic configuration diagram showing a transmitter for explaining a second embodiment of the invention. In FIG. 7, parts overlapping those in FIG. 1 for description of the first embodiment are referred to by the same numerals.

As shown in FIG. 7, the transmitter according to the second embodiment of the invention comprises: an amplitude/phase extraction portion 11 for separating an input baseband IQ signal 101 into a baseband amplitude signal 102 and a baseband phase signal 103 and outputting the signals 102 and 103; a phase modulation means 12 for applying phase modulation of a carrier signal on the baseband phase signal 103 and outputting a phase-modulated high-frequency signal 104; a linear mixer 21 for applying amplitude modulation on the phase-modulated high-frequency signal 104; a variable gain amplifier 14 for amplifying the output of the mixer 21; a high-frequency power amplifier 15 for amplifying the output of the variable gain amplifier 14 as high-frequency power and outputting a transmitting signal 205; and a supply voltage/bias current control circuit 17 for generating a supply voltage 109 and a bias current to the high-frequency power amplifier 15 on the basis of the baseband amplitude signal 102, an average output level control signal 106 and an operating mode set signal 107.

In this embodiment, the mixer 21 is inserted between the phase modulation means 12 and the variable gain amplifier 14. For example, the mixer 21 is a linear multiplier for applying amplitude modulation on the phase-modulated high-frequency signal 104 output from the phase modulation means 12 on the basis of the baseband amplitude signal 102.

Although this embodiment has been described on the case where the mixer 21 is used as an amplitude modulation means, a portion for controlling the output power level in a wide range after the amplitude modulation is the same as in the first embodiment.

That is, in this embodiment, as shown in FIG. 4, the gain of the variable gain amplifier 14 is controlled and the supply voltage 109 and bias current to the high-frequency power amplifier 15 are controlled in the supply voltage/bias current control circuit 17 on the basis of the average output level control signal 106 and the operating mode set signal 107.

In this manner, the transmitter according to this embodiment is configured so that the operating mode of the high-frequency power amplifier 15 can be selectively switched over between the linear mode and the saturation mode, and that one and the same high-frequency power amplifier 15 can be used in the two modes in order to control the output level in a wide range.

Although this embodiment has been described on the case where the variable gain amplifier 14 in the rear of the mixer 21 operates in the linear mode, the variable gain amplifier 14 may be operated in the saturation mode in the same manner as the high-frequency power amplifier 15. Also in this case, the gain of the variable gain amplifier 14 is changed by a predetermined value α in accordance with the operating mode of the high-frequency power amplifier 15.

This embodiment has been described on the case where the mixer 21 is disposed between the phase modulation means 12 and the variable gain amplifier 14. In this case, when blocks on and after the variable gain amplifier 14 are operated in the saturation mode while the linear mixer 21 low in power efficiency is disposed as near to the low-power front stage side as possible to suppress power loss to a minimum, high power efficiency as a whole can be achieved. However, even in the case where the mixer 21 is disposed in the rear of the variable gain amplifier 14, the effect of the invention can be obtained when the gain of the variable gain amplifier 14 is changed by a predetermined value α in accordance with the operating mode of the high-frequency power amplifier 15.

Third Embodiment

Figure 8:
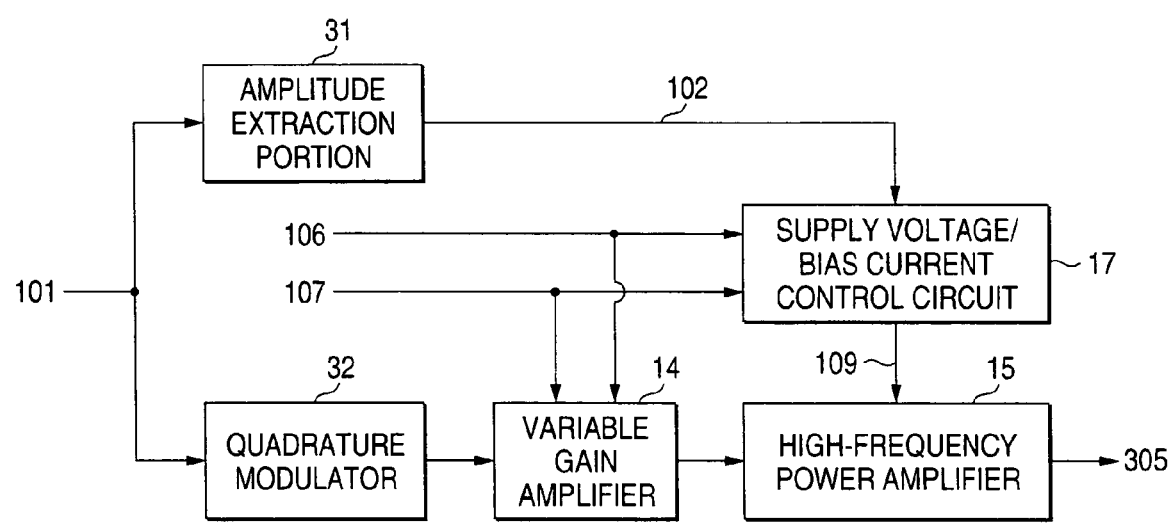
FIG. 8 is a schematic configuration diagram showing a transmitter for explaining a third embodiment of the invention.
Figure 9:
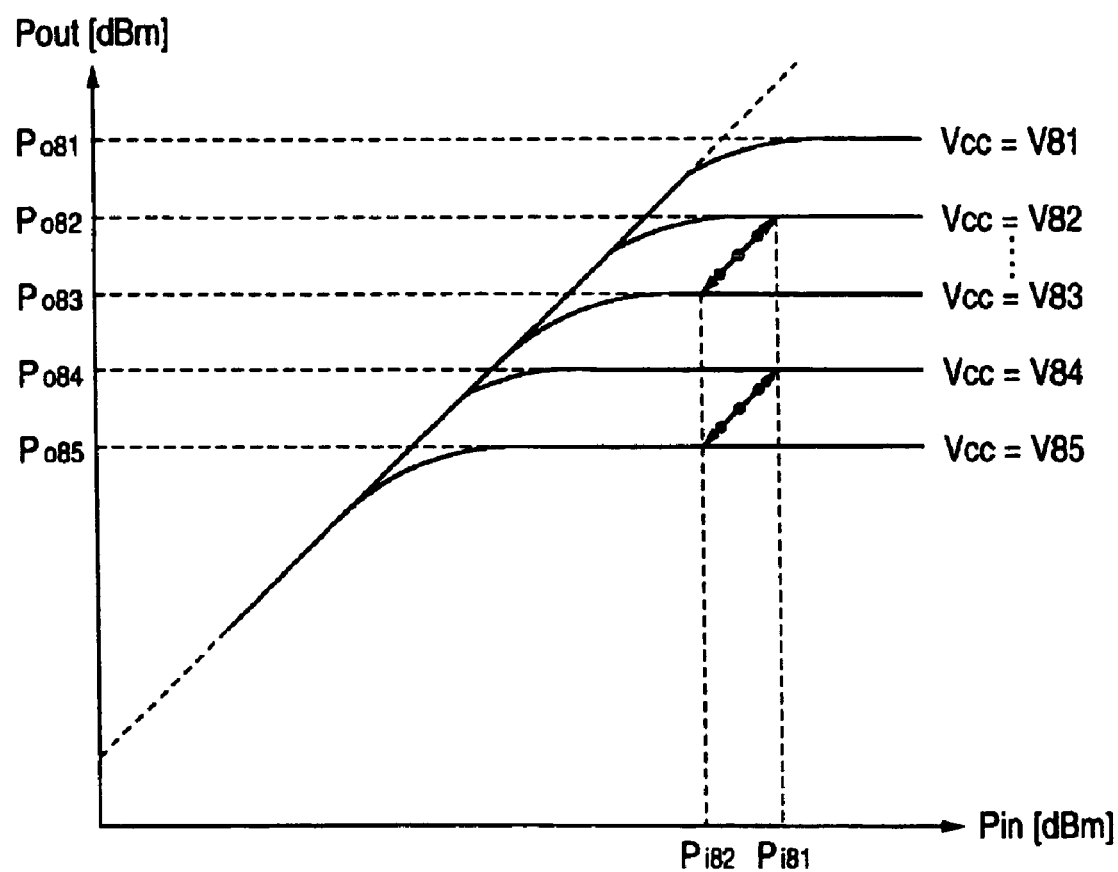
FIG. 9 is a graph showing an example of input-output power characteristic ($P_{in}$-$P_{out}$ characteristic) of the power amplifier.

FIG. 8 is a schematic configuration diagram showing a transmitter for explaining a third embodiment of the invention. In FIG. 8, parts overlapping those in FIG. 1 for description of the first embodiment are referred to by the same numerals.

As shown in FIG. 8, the transmitter according to the third embodiment of the invention comprises: an amplitude extraction portion 31 for extracting a baseband amplitude signal 102 from an input baseband IQ signal 101 and outputting the baseband amplitude signal 102; a quadrature modulator 32 for performing phase modulation and amplitude modulation of a carrier from the baseband IQ signal 101; a variable gain amplifier 14 for amplifying the output of the quadrature modulator 32; a high-frequency power amplifier 15 for amplifying the output of the variable gain amplifier 14 as high-frequency power and outputting a transmitting signal 305; and a supply voltage/bias current control circuit 17 for generating a supply voltage 109 and a bias current to the high-frequency power amplifier 15 on the basis of the baseband amplitude signal 102, an average output level control signal 106 and an operating mode set signal 107.

In this embodiment, the function of performing phase modulation and amplitude modulation of the carrier based on the baseband IQ signal 101 is achieved by the quadrature modulator 32.

Although this embodiment has been described on the case where the quadrature modulator 32 is used as means for performing phase modulation and amplitude modulation, a portion for controlling the output power level in a wide range after the modulation is the same as in the first embodiment.

That is, in this embodiment, as shown in FIG. 4, the gain of the variable gain amplifier 14 is controlled and the supply voltage 109 and bias current to the high-frequency power amplifier 15 are controlled in the supply voltage/bias current control circuit 17 on the basis of the average output level control signal 106 and the operating mode set signal 107.

In this manner, the transmitter according to this embodiment is configured so that the operating mode of the high-frequency power amplifier 15 can be selectively switched over between the linear mode and the saturation mode, and that one and the same high-frequency power amplifier 15 can be used in the two modes in order to control the output level in a wide range.

The transmitter according to the invention can be applied to a radio communication apparatus such as a portable wireless terminal apparatus or a radio base station. When the transmitter according to the invention is applied to a portable radio communication terminal apparatus or the like, power efficiency can be improved to prevent exhaustion of a battery to thereby elongate the use-life. Because power efficiency is improved, the size of the high-frequency power amplifier can be reduced. Moreover, because the amount of heat generated can be reduced, the size of the radio communication apparatus equipped with the transmitter can be reduced. In addition, the invention can be applied to the case where a wide transmission control range is required as in a third generation communication method etc.

When the transmitter according to the invention is applied to a base station apparatus of a radio system having a plurality of high-power transmitters, space capacity can be improved because power efficiency at high-output power of the high-frequency power amplifier can be improved to reduce the size of the high-frequency power amplifier while the amount of heat generated can be reduced to prevent increase in equipment size. In addition, the invention can be applied to the case where a wide transmission control range is required as in a third generation communication method etc.

Although the invention has been described in detail and with reference to specific embodiments, it is apparent to those skilled in the art that various changes and modifications may be made without departing from the spirit and scope of the invention.

This application is based on Japanese Patent Application No. 2003-348243 filed on Oct. 7, 2003 and the contents thereof are taken in as a reference.

INDUSTRIAL APPLICABILITY

As described above, the transmitter and the transmission output control method according to the invention have an effect of covering the high-efficiency output level in a wide range and are useful for a radio communication apparatus such as a portable wireless terminal apparatus or a radio base station.

The invention claimed is:

1. A transmitter for outputting a transmitting signal while amplifying power of the transmitting signal, comprising:
   a variable gain amplification means for amplifying an input modulated signal based on the transmitting signal and controlling the gain based on a control signal;
   a power amplification means connected to the rear of the variable gain amplification means;
   a multiplier for multiplying the amplitude signal of the transmitting signal and the phase-modulated signal obtained by modulation of the phase signal of the transmitting signal to thereby apply amplitude modulation, wherein the power amplification means performs power amplification on the basis of the amplitude-modulated signal; and
   a power amplification control means for controlling a supply voltage of the power amplification means on the basis of the control signal, wherein:
   the power amplification means has a linear operating mode for amplifying power by using a linear operating region in input-output power characteristic of the power amplification means, and a saturation operating mode for amplifying power by using a saturation operating region in input-output power characteristic of the power amplification means;
   the control signal includes an operating mode set signal for setting the operating mode of the power amplification means; and
   the power amplification means operates in either operating mode on the basis of the operating mode set signal.

2. The transmitter according to claim 1, wherein the multiplier is provided in front of the variable gain amplification means.

* * * * *